United States Patent [19]

Norbeck et al.

[11] Patent Number: 4,554,463
[45] Date of Patent: Nov. 19, 1985

[54] TRIGGER CIRCUIT FOR SOLID STATE SWITCH

[75] Inventors: Dean K. Norbeck, York; Harold R. Schnetzka, Spring Grove, both of Pa.

[73] Assignee: Borg-Warner Corporation, Chicago, Ill.

[21] Appl. No.: 498,366

[22] Filed: May 26, 1983

[51] Int. Cl.⁴ .............................................. H03K 17/72
[52] U.S. Cl. ............................ 307/252 H; 307/252 J; 307/297
[58] Field of Search ............ 307/252 R, 252 H, 252 J, 307/253, 268, 270, 297

[56] References Cited

U.S. PATENT DOCUMENTS 3,846,644 11/1974 Takagi et al. ..................... 307/252 J
3,987,314 10/1976 Leowald et al. .................. 307/252 J

OTHER PUBLICATIONS

General Electric SCR Manual 6th Edition, dated 1979, pp. 85 & 86.
Westinghouse Electric Corp. (Semiconductor Division), Application Data 54-540, dated Dec. 1976, pp. 1-4.

Primary Examiner—John Zazworsky
Attorney, Agent, or Firm—James E. Tracy

[57] ABSTRACT

The power dissipated, in a trigger circuit for gating on a semiconductor switch, is minimized by employing a constant current source to provide the gate trigger current. This assures adequate triggering regardless of supply voltage variations or switch intrinsic control voltage requirements. Power is saved by supplying only the current required to drive the semiconductor switch on, thereby preventing overdrive. With constant d-c gate current, the precise amount of power needed to turn on and close the switch is provided while wasting relatively little energy due to gate intrinsic voltage variations of the switch or to input line voltage variations.

2 Claims, 1 Drawing Figure

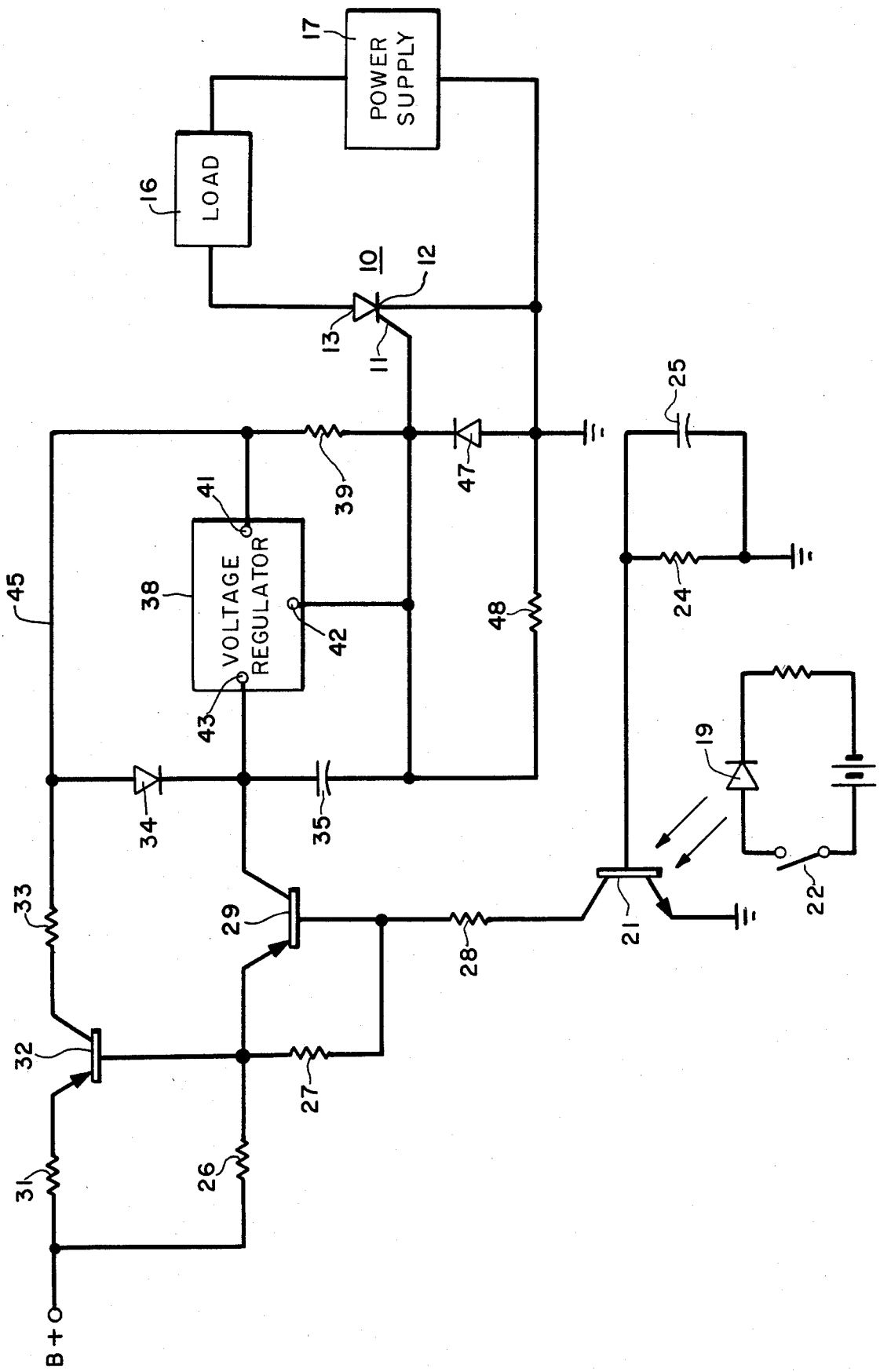

//  4,554,463

TRIGGER CIRCUIT FOR SOLID STATE SWITCH

BACKGROUND OF THE INVENTION

This invention relates to a trigger circuit for gating on and closing a solid state or semiconductor switch, where the switch requires a d-c triggering pulse.

When a solid state switch, such as a transistor, an SCR (silicon controlled rectifier), a GTO (gate turn off switch), etc., is triggered into conduction, or turned on, by a d-c triggering signal applied to the switch's control terminal or gate, the triggering signal is usually produced by a gate voltage source which is likely to exhibit unwanted voltage variations. This is particularly true when the d-c gate voltage is developed from a-c power line voltage. In addition to source variations, the intrinsic control voltage of the solid state switch, required to obtain control current flow in the switch, may vary from unit to unit. As the d-c triggering signal varies in amplitude, in response to the supply voltage and intrinsic device voltage variations, the power consumed in gating on and closing the switch is apt to vary over a relatively wide range. At times the driving power may be inadequate to properly trigger the solid state switch, while at other times the switch may be overdriven, resulting in a substantial power waste.

The present invention constitutes a significant improvement over the prior trigger circuits since it provides the optimum triggering drive at all times to properly gate a solid state switch into conduction without wasting as much power. This is achieved by a gate driver that always supplies only the precise amount of current required to turn the switch on, and this is accomplished in spite of any gate voltage variations or disturbances.

SUMMARY OF THE INVENTION

The trigger circuit of the invention turns on a solid state switch having a control terminal, a common input-output terminal and an output terminal. The trigger circuit comprises a source of d-c supply voltage normally having a fixed magnitude but subject to undesired variations. There is a constant current source and controllable means which, when actuated, couples the d-c supply voltage source to the input of the constant current source to apply a d-c voltage thereto. Means are provided for coupling the output of the constant current source to the control terminal and to the common input-output terminal of the solid state switch in order to translate between those two terminals, when the controllable means is actuated, constant d-c gate current to turn the switch on, despite the presence of any unwanted variations in the d-c supply voltage or variations in the switch intrinsic control voltage requirements. Finally, the trigger circuit comprises actuating means for actuating the controllable means to control the triggering of the solid state switch.

DESCRIPTION OF THE DRAWING

The features of the invention which are believed to be novel are set forth with particularity in the appended claims. The invention may best be understood, however, by reference to the following description in conjunction with the accompanying drawing which schematically illustrates a solid state switching system for coupling a power supply to a load, the switching system having a trigger circuit constructed in accordance with the present invention.

DESCRIPTION OF THE PREFERRED EMBODIMENT

The triggered solid state switch in the illustrated embodiment takes the form of an SCR 10 having a control or gate terminal 11, a common input-output or cathode terminal 12 and an output or anode terminal 13. Of course, and as is apparent, the function served by SCR 10 could be performed by a variety of other semiconductor switches, such as a transistor or a GTO. When a transistor is employed, the base, emitter and collector terminals of the transistor would serve as the control, common input-output and output terminals, respectively. Whatever the form of the solid state switch, it is turned on or closed by passing gate current between the control terminal and the common input-output terminal, and if an appropriate potential difference is established between the input-output terminal and the output terminal those two terminals will be essentially connected together to complete an interconnection of external circuit elements.

To simplify the drawing, SCR 10 is shown coupled in series with a load 16 and a power supply 17. When the SCR is triggered or fired into conduction, load 16 is effectively energized by power supply 17, assuming that the voltage provided by the power supply is appropriately polarized to translate current through SCR 10 in the direction from the anode to the cathode. If power supply 17 produces a d-c voltage, of the correct polarity, the load will be continuously energized so long as gate current is delivered to gate terminal 11. On the other hand, if power supply 17 is an a-c voltage source, current will flow through load 16 and SCR 10 only during the positive half cycles of the a-c voltage when the SCR's anode is positive relative to its cathode. In a well-known manner, by controlling the timing of the gate current supplied to gate terminal 11, the firing angle of SCR 10 during each positive half cycle of the applied a-c voltage may be regulated to vary the power flow to load 16. The greater the conduction angle of the SCR during each half cycle, the greater the power flow. If load 16 comprises, for example, an a-c motor, the motor speed may be varied by adjusting the conduction angle.

SCR 10 and its trigger circuit, or gate driver, may thus be employed in any control system for regulating the power translated from an a-c source to a load circuit. It is well-known that a network of such SCRs, each having its own gate driver, may be utilized to adjust the power delivered to a load. For example, if the power supply provides three-phase a-c power the SCR network may comprise a three-phase full wave rectifier bridge having three pairs of SCRs, to each of which pairs is applied a respective one of the three alternating phase voltages provided by the three-phase a-c source. Six independent gate drivers would be used to control the conduction angles of the six SCRs in the network in order to establish at the output of the bridge a d-c voltage of a desired magnitude and to control the d-c power supplied through the rectifier bridge to a load, such as an inverter which in turn operates an a-c motor.

If controlled a-c power must be directly translated from the three-phase a-c source to a three-phase load, such as a three-phase a-c motor, a network of SCRs may be formed to provide a three-phase a-c switch for varying the magnitude of the three alternating currents which flow to that load. Such a switch would also include three pairs of SCRs, each pair being connected in a respective one of the three line conductors over which the three phase voltages are received from the a-c power supply. The two SCRs of each pair are shunt connected with each other but oppositely poled, namely the anode of each SCR directly connects to the cathode of the other SCR. By regulating the conduction angles of the six SCRs, the three alternating load or phase currents, supplied to the three-phase a-c motor, may be established at a desired level.

A control system for controlling the firing of the six SCRs in a three-phase full wave rectifier bridge, or the six SCRs in a three-phase a-c switch, to regulate power flow is disclosed in the copending U.S. patent application Ser. No. 434,018, filed Oct. 12, 1982 in the name of Harold R. Schnetzka et al, issued Feb. 12, 1985 as U.S. Pat. No. 4,499,534 and assigned to the present assignee. Six independent gate drivers, or trigger circuits, are employed in that patent application and each of those drivers may be constructed in accordance with the present invention. So constructed, the operation of the control system of the aforementioned patent application would be improved because the power consumed by the six gate drivers would be minimized.

Consideration will now be given to the trigger circuit of the invention. The source of positive d-c voltage labeled B+ in the drawing is customarily produced by rectifying and filtering a-c line voltage. Hence, line voltage variations will cause unwanted fluctuations in the B+ voltage. The trigger circuit, however, is made immune to such B+ variations, and to intrinsic gate to cathode voltage variations, in a manner to be explained, so that the driving current supplied to gate terminal 11 will always be held constant regardless of the presence of undesired variations in the d-c supply voltage, namely B+, or variations in the intrinsic control voltage requirements.

Light emitting diode (LED) 19 in combination with transistor 21 constitute an optically-coupled isolator. To initiate the development of gate current for SCR 10, switch 22 is closed to energize LED 19 which turns on and saturates transistor 21. Of course, a simple energizing circuit for LED 19 is schematically shown to avoid encumbering the drawing. It is contemplated that low-voltage logic circuitry (such as is included in the aforementioned patent application) would probably be employed to energize the LED. The isolator 19, 21 provides electrical isolation between the logic circuitry and the SCR circuit which may handle relatively high voltages. Resistor 24 and capacitor 25 effect noise immunity to prevent false triggering of transistor 21 due to spurious noise.

When transistor 21 is turned on by LED 19 current flows from the B+ supply voltage through resistors 26, 27 and 28 and also through the emitter-base conduction path of transistor 29, turning on and saturating the transistor. This forces current to flow through resistor 31 and the emitter-base conduction path of transistor 32 which thereupon saturates and turns on, causing collector current to flow through resistor 33 and diode 34. This collector current, along with the collector current from transistor 29, initially flows through capacitor 35 and the gate-cathode conduction path of SCR 10 to create a sharply rising current spike at the leading edge of the current pulse supplied to the SCR gate, causing a desired fast turn-on of the SCR. The amplitude of this current spike is determined by the combination of resistors 26, 31 and 33 and d-c voltage B+. As capacitor 35 charges up, voltage regulator 38 begins to become active and capacitor 35 will charge to voltage B+, less the sum of the voltage drop across resistor 26 and the saturation voltage between the emitter and collector of transistor 29. The circuit now functions as a constant current source, supplying constant d-c gate current through resistor 39 and between gate terminal 11 and cathode terminal 12 so long as switch 22 remains closed.

Preferably, voltage regulator 38 is an integrated circuit, several such circuits being available. For example, regulator 38 may be an integrated circuit made by Motorola Semiconductor Products, Inc. under the designation MC78L05CP. The voltage regulator 38 maintains a constant d-c voltage between its output pin or terminal 41 and its ground pin or terminal 42, despite voltage variations at its input pin 43 which would result from unwanted B+ variations. A constant or fixed voltage between pins 41 and 42 forces constant current through resistor 39 and all of this current flows to the gate of SCR 10. The magnitude of the constant current will be determined by the output voltage specification of voltage regulator 38 divided by the resistance of resistor 39. Hence, the resistance may be selected to provide the precise gate current required for optimum drive. The gate driving power will thus be minimized because only the power needed to trigger SCR 10 will be used, even though supply voltage B+ may exhibit substantial variations and disturbances and the characteristic gate to cathode voltage may vary from device to device. Relatively little power will be wasted, and this can result in a major saving when SCR 10 is of the high power handling type. In addition, proper triggering current is assured.

In the illustrated embodiment voltage regulator 38 may have a maximum current output which is substantially less than that required to drive the SCR 10. This is achieved by means of transistor 32 which supplies collector current over conductor 45 and around regulator 38 to resistor 39. The current through the resistor is thus shared by regulator 38 and transistor 32. Of course, even though the majority of the current flowing through resistor 39 and the gate-cathode path of SCR 10 may be contributed by transistor 32, the total current flowing through resistor 39 and delivered to the SCR gate will always be held fixed by regulator 38 in spite of changes in the B+ voltage. To explain further, if the B+ supply voltage drops, for example, the current through conductor 45 will try to decrease and this tends to decrease the total current through resistor 39 and the voltage at output pin 41. However, regulator 38 will automatically compensate by increasing the base current of transistor 32 which in turn increases the current through conductor 45, returning it to its original value. The output voltage between pins 41 and 42 will remain constant. With a constant voltage between pins 41 and 42, the current translated through resistor 39 and delivered to gate terminal 11 has to be constant.

Of course, if the specifications of voltage regulator 38 are such that the entire gate current needed to fire SCR 10 may be drawn from the regulator, circuit elements 31-34 and 45 may be eliminated.

Resistor 31 helps to stabilize the trigger circuit by adding emitter resistance. Diode 34 provides a fast charge path for capacitor 35 and protection against reverse voltage on the voltage regulator. Diode 47 protects the SCR against any reverse bias presented to the SCR gate. Resistor 48 shunts any unwanted bias current away from the SCR gate. Resistor 27 helps to remove stored charges from transistor 29, thus providing a faster turn-off time.

The invention therefore provides a unique trigger circuit or gate driver for d-c gating a solid state switch with a constant current source which is immune to input voltage variations, and solid state switch intrinsic voltage variations, the fixed current being selected to match the solid state switch to supply the optimum gate driving power, thereby precluding needless power dissipation and inadequate gate drive otherwise occurring in response to those voltage variations.

While a particular embodiment of the invention has been shown and described, modifications may be made, and it is intended in the appended claims to cover all such modifications as may fall within the true spirit and scope of the invention.

We claim:

1. A trigger circuit for gating on an SCR having gate, cathode and anode terminals, where the SCR is subject to variations in its intrinsic gate-to-cathode control voltage requirements, said trigger circuit comprising:
    a source of d-c supply voltage normally having a fixed magnitude but subject to undesired variations;
    an integrated circuit voltage regulator having an input pin, an output pin and a ground pin;
    means including the emitter-collector conduction path of a transistor for coupling said d-c supply voltage source to the input pin of said voltage regulator;
    a resistor having one end connected to the output pin of said voltage regulator and the outer end connected to the ground pin and also to the SCR's gate terminal;
    and actuating means for turning said transistor on to apply a d-c voltage, from said d-c supply voltage source, to the input pin of said voltage regulator which functions to maintain a constant d-c voltage between its output and ground pins, thereby translating constant d-c gate current through said resistor and from the SCR's gate terminal to its cathode terminal to turn the SCR on despite the presence of any unwanted variations in the d-c supply voltage or variations in the intrinsic gate-to-cathode control voltage requirements.

2. A trigger circuit for gating on an SCR having gate, cathode and anode terminals, where the SCR is subject to variations in its intrinsic gate-to-cathode control voltage requirements, said trigger circuit comprising:
    a source of d-c supply voltage normally having a fixed magnitude but subject to undesired variations;
    an integrated circuit voltage regulator having an input pin, an output pin and a ground pin;
    means including the emitter-collector conduction path of a first transistor for coupling said d-c supply voltage source to the input pin of said voltage regulator;
    means including the emitter-collector conduction path of a second transistor for bypassing said voltage regulator and coupling said d-c supply voltage source directly to the regulator's output pin;
    a resistor having one end connected to the output pin of said voltage regulator and the other end connected to the ground pin and also to the SCR's gate terminal;
    and actuating means for turning said first and second transistors on to apply d-c voltages, from said d-c supply voltage source, to the input and output pins of said voltage regulator which functions to maintain a constant d-c voltage between its output and ground pins, thereby translating constant d-c gate current through said resistor and from the SCR's gate terminal to its cathode terminal to turn the SCR on despite the presence of any unwanted variations in the d-c supply voltage or variations in the intrinsic gate-to-cathode control voltage requirements,
    the constant gate current flowing through said resistor being formed by the combination of the current flowing from said regulator and out of the output pin and the current flowing through said second transistor, the combined current through said resistor being held constant by the operation of said voltage regulator.

* * * * *

UNITED STATES PATENT OFFICE
CERTIFICATE OF CORRECTION

PATENT NO. : 4,554,463

DATED : November 19, 1985

INVENTOR(S) : DEAN K. NORBECK and HAROLD R. SCHNETZKA

It is certified that error appears in the above-identified patent and that said Letters Patent are hereby corrected as shown below:

Column 5, line 33, cancel "outer" and insert
-- other --.

Signed and Sealed this

Twenty-eighth Day of January 1986

[SEAL]

Attest:

DONALD J. QUIGG

Attesting Officer

Commissioner of Patents and Trademarks